United States Patent
Mozer et al.

(10) Patent No.: US 9,682,663 B2
(45) Date of Patent: Jun. 20, 2017

(54) MECHANICAL FIXING SYSTEM FOR AERONAUTICAL DISPLAY DEVICE

(71) Applicant: THALES, Courbevoie (FR)

(72) Inventors: Laurent Mozer, Merignac (FR); Daniel Laret, St Medard en Jalles (FR); Jean-Marie Goy, Gradignan (FR)

(73) Assignee: Thales, Courbevoie (FR)

( * ) Notice: Subject to any disclaimer, the term of this patent is extended or adjusted under 35 U.S.C. 154(b) by 0 days.

(21) Appl. No.: 15/068,514

(22) Filed: Mar. 11, 2016

(65) Prior Publication Data

US 2016/0264061 A1 Sep. 15, 2016

(30) Foreign Application Priority Data

Mar. 13, 2015 (FR) ...................................... 15 00482

(51) Int. Cl.
| | | |
|---|---|---|
| *G06F 1/16* | (2006.01) | |
| *B60R 11/02* | (2006.01) | |
| *B60K 35/00* | (2006.01) | |
| *B60K 37/04* | (2006.01) | |
| *B64D 43/00* | (2006.01) | |
| *H05K 7/14* | (2006.01) | |

(52) U.S. Cl.
CPC .......... *B60R 11/0229* (2013.01); *B60K 35/00* (2013.01); *B60K 37/04* (2013.01); *B64D 43/00* (2013.01); *H05K 7/1412* (2013.01); *B60K 2350/1032* (2013.01); *B60K 2350/941* (2013.01)

(58) Field of Classification Search
CPC ...... H05K 7/14; H05K 7/1401; H05K 7/1407; H05K 7/1408; H05K 7/1411; H05K 7/1412; G06F 1/1601; G06F 1/1626; G06F 1/1637; B60K 2350/00
See application file for complete search history.

(56) References Cited

U.S. PATENT DOCUMENTS

| | | | | |
|---|---|---|---|---|
| 4,532,513 A | * | 7/1985 | Halvorson ........... | H05K 7/1427 312/7.2 |
| 6,559,829 B1 | * | 5/2003 | Matsuo ..................... | G09F 7/18 248/918 |
| 6,700,787 B1 | * | 3/2004 | Beseth ................. | H05K 7/1412 361/728 |

(Continued)

FOREIGN PATENT DOCUMENTS

WO   WO 03/080437 A2   10/2003

*Primary Examiner* — Anthony Q Edwards
(74) *Attorney, Agent, or Firm* — Blakely, Sokoloff, Taylor & Zafman LLP

(57) ABSTRACT

The general field of the invention is that of the display devices comprising a rectangular display screen, said display device compatible with an aeronautical standard for mechanical interfacing with an instrument panel, said standard being defined by fixing positions and fixing means at said positions. The display device according to the invention comprises:

two identical removable mechanical bars of a length equal to the length of the screen, each bar being arranged under one of the long sides of the screen, each bar comprising:
first fixing means at said defined fixing positions, said first fixing means arranged so as to fix said bar on the instrument panel;
two fixing holes, each fixing hole arranged at one of the ends of said bar,
second fixing means making it possible to fix the display device in the four fixing holes of the two bars.

1 Claim, 4 Drawing Sheets

(56) References Cited

U.S. PATENT DOCUMENTS

| | | | | |
|---|---|---|---|---|
| 7,032,862 B2* | 4/2006 | Landes | ............... | H05K 7/18 211/103 |
| 7,188,400 B1* | 3/2007 | Beseth | ............... | B64D 43/00 29/428 |
| 7,473,931 B1* | 1/2009 | Beseth | ............... | B64D 43/00 257/59 |
| 8,274,783 B2* | 9/2012 | Polizzotto | ............... | B64D 43/00 248/230.1 |
| 8,449,009 B1* | 5/2013 | Bopp | ............... | B60K 35/00 248/27.1 |
| 8,477,504 B2* | 7/2013 | Bopp | ............... | B64D 43/00 244/118.5 |
| 2003/0183730 A1* | 10/2003 | Landes | ............... | H05K 7/18 248/27.1 |
| 2005/0185381 A1* | 8/2005 | Ono | ............... | H05K 9/0015 361/715 |
| 2008/0094255 A1 | 4/2008 | Bethel | | |
| 2008/0215192 A1* | 9/2008 | Hardman | ............... | G01C 23/00 701/3 |
| 2010/0081307 A1 | 4/2010 | Bopp | | |
| 2011/0176267 A1* | 7/2011 | Polizzotto | ............... | B64D 43/00 361/679.21 |

\* cited by examiner

MECHANICAL FIXING SYSTEM FOR AERONAUTICAL DISPLAY DEVICE

FIELD

The field of the invention is that of the mechanical fixing of aeronautical equipment items on an aircraft instrument panel. More specifically, the field of the invention is that of the aeronautical standard "ARINC 739" entitled "Multi Purpose Control and Display Unit (MCDU) and Interfaces". The acronym "ARINC" stands for "Aeronautical Radio, INCorporated".

BACKGROUND

The aeronautical equipment items mounted on an instrument panel obey fixing interface standards. By way of example, FIG. 1 represents, from front view, an equipment item 1 of "MCDU" type. The front face of the equipment item is of rectangular form. It comprises a display screen 11, a control keyboard 12 and six fixing screws 13. Four fixing screws 13A are situated at the four corners of the rectangle and two fixing screws 13B are situated at the centre of the long sides of the front face rectangle. The six fixing screws are of "Zeus" type, that is to say that they are fixed by turning them by a quarter turn, which facilitates the mounting and unmounting of the equipment item.

As long as the display screen 11 remains of small dimensions, the spread of the screws 13A and 13B is not a problem. The same does not apply when the display screen has to occupy the largest possible surface area of the front face. As can be seen in FIG. 2, the space lost due, in particular, to the central fixing screws 13B is significant. Thus, the width of the display screen cannot exceed a width $I_V$ corresponding to the greater width $I_E$ of the equipment item minus at least two times the diameter $\phi$ of the central fixing screw heads. Now, for certain applications, particularly when the aim is to ensure the maximum of continuity between two display devices placed side by side, it is essential for the useful surface area of the display screen to best occupy the entire width of the front face.

SUMMARY

The display device according to the invention does not have these drawbacks. It comprises two adaptation bars comprising both mechanical interfaces compatible with the aeronautical standard and interfaces allowing for the use of a large display device. More specifically, the subject of the invention is a display device comprising at least one rectangular display screen, said display device compatible with an aeronautical standard for mechanical interfacing with an instrument panel, said aeronautical standard being defined at least by fixing positions and fixing means at said positions, characterized in that the display device comprises:
  two identical removable mechanical bars of a length substantially equal to the length of the display screen, each bar being arranged under one of the long sides of the display screen, each bar comprising:
    first fixing means at said fixing positions defined by said aeronautical standard, said first fixing means arranged so as to fix said bar on the instrument panel;
    two fixing holes, each fixing hole arranged at one of the ends of said bar,
  second fixing means making it possible to fix the display device in the four fixing holes of the two bars.

Advantageously, the aeronautical standard being the "ARINC 739" standard entitled "Multi Purpose Control and Display Unit and Interfaces", each bar comprises three fixing means of identical "quarter-turn" screw type, the first situated at a first end of the bar, the second situated at the centre of the bar and the third situated at the second end of the bar.

BRIEF DESCRIPTION OF THE DRAWINGS

The invention will be better understood and other advantages will become apparent on reading the following description, given in a nonlimiting manner, and by virtue of the attached figures in which.

DETAILED DESCRIPTION

Figure 1:
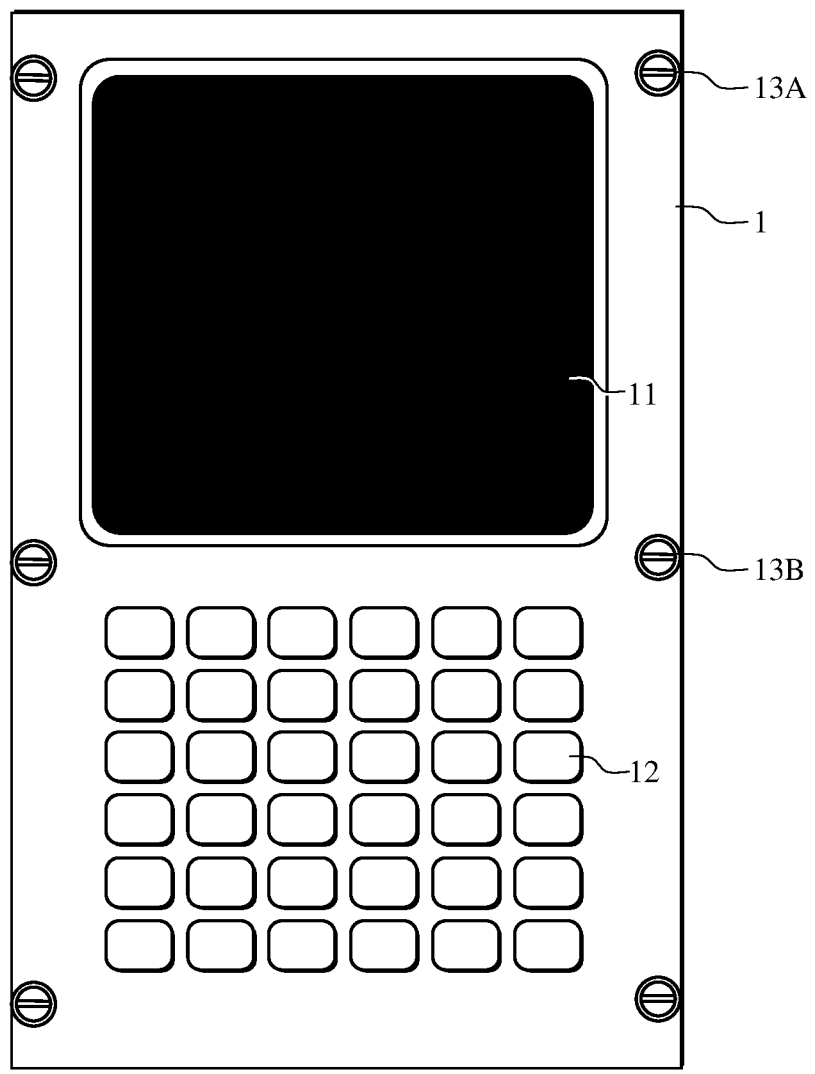
FIG. 1 represents a front face of an aeronautical equipment item of MCDU type, said front face mounted in an instrument panel according to the prior art.
Figure 2:
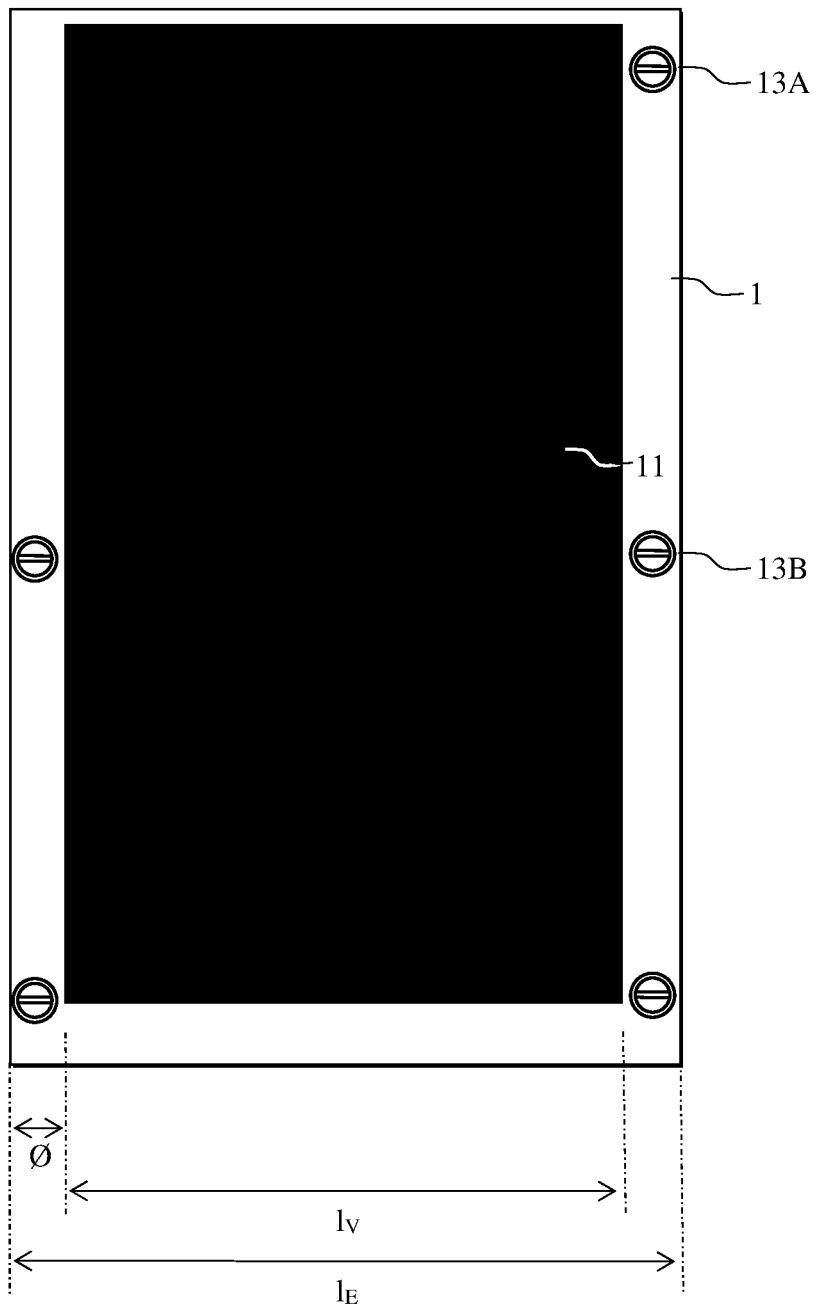
FIG. 2 represents a front face of an aeronautical equipment item of MCDU type with large display screen, said front face mounted in an instrument panel according to the prior art.
Figure 3:
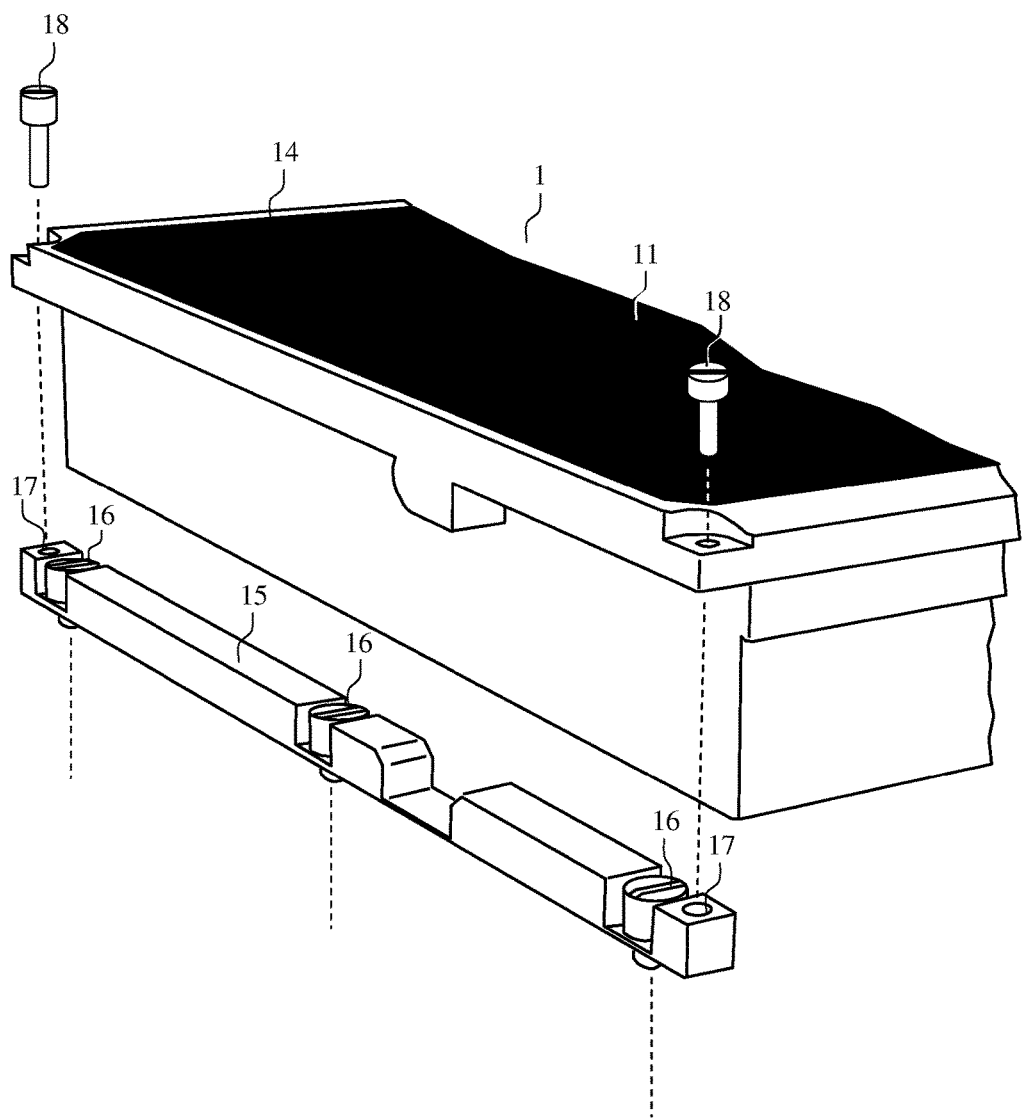
FIG. 3 represents a partial exploded view in perspective of an aeronautical equipment item with large display screen according to the invention.

As a nonlimiting example, FIG. 3 represents a partial exploded view in perspective of an aeronautical equipment item 1 with large display screen according to the invention. This view represents the left side of the equipment item. The right side of the equipment item is perfectly symmetrical and comprises the same arrangements.

The display device comprises a large display screen 11 mounted in a front face 14. The front face 14 contains all the electronic addressing devices as well as the display screen lighting means. These various means are not represented in FIG. 3. The current technologies make it possible to house these various means in a small thickness.

This front face 14 is rectangular. It comprises, under the two longest sides, two identical removable mechanical bars 15 of a length substantially equal to the length of the display screen, each bar 15 being arranged under one of the long sides of the display screen. In FIG. 3, each bar is substantially in the form of an elongate bar of substantially square section.

Each bar 15 comprises first fixing means 16 at the fixing positions defined by an aeronautical standard defining the mechanical fixing interfaces of the display device. As has been stated, the aeronautical standard can be, by way of example, the "ARINC 739" standard entitled "Multi Purpose Control and Display Unit and Interfaces".

These first fixing means 16 are arranged so as to fix the bar on an aircraft instrument panel. In FIG. 3, these means are three quarter-turn screws of "Zeus" type arranged at the centre and at the two ends of the bar 15.

Each bar also comprises two fixing holes 17 arranged at the ends of the bar. Second fixing means 18 make it possible to fix the display device in the four fixing holes of the two bars. In the present case, they are simple fixing screws.

When the equipment item is being mounted, the bars are first of all fixed on the instrument panel at the corresponding positions then the aeronautical equipment item is fixed onto the bars. When the equipment item is removed, the mechanical bars can either be left in place or removed with the equipment item.

Figure 4:
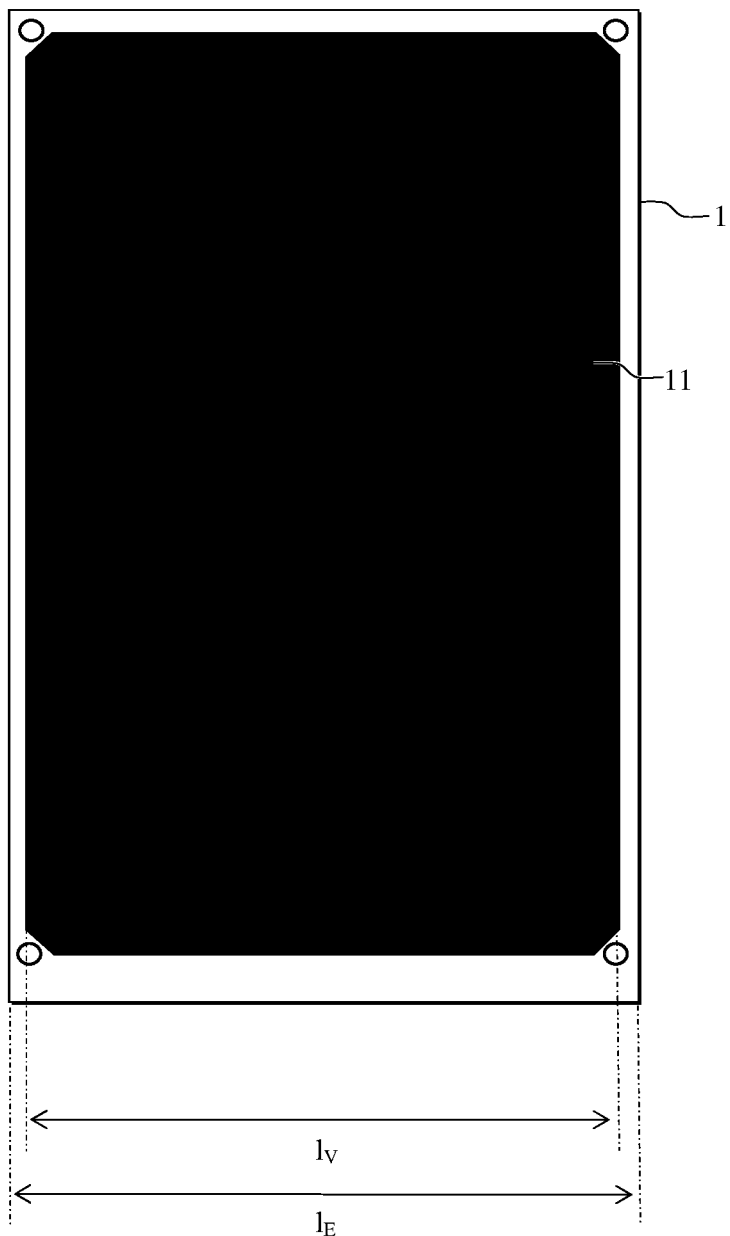
FIG. 4 represents a front face of an aeronautical equipment item of MCDU type with large display screen, said front face mounted in an instrument panel according to the invention.

As can be seen in FIG. 4, the width $I_V$ of the display screen can now be very close to the width $I_E$ of the display device. The siting is now limited only by the constraints of mechanical and electrical installation of a display screen in a display equipment item.

Of course, the display device according to the invention can easily be adapted to other aeronautical standards and to a wide variety of aeronautical equipment items while remaining within the scope of this invention.

What is claimed is:

1. A display device comprising at least one rectangular display screen, said display device compatible with an aeronautical standard for mechanical interfacing with an instrument panel, said aeronautical standard comprising "ARINC 739" entitled "Multi Purpose Control and Display Unit and Interfaces", and said aeronautical standard being defined at least by fixing positions and fixing devices at said fixing positions, wherein the display device comprises:

two identical removable mechanical bars of a length substantially equal to a length of the at least one rectangular display screen, each bar being arranged under one of the long sides of the at least one rectangular display screen, each bar comprising:

three first fixing devices of identical "quarter-turn" screw type, a first fixing device situated at a first end of the bar, a second fixing device situated at a center of the bar, and a third fixing device situated at a second end of the bar, said three first fixing devices arranged so as to fix said bar on the instrument panel, and two fixing holes, each fixing hole arranged at one of the ends of said bar;

second fixing devices to fix the display device in the four fixing holes of the two bars.

* * * * *